US006587565B1

(12) United States Patent
Choi

(10) Patent No.: US 6,587,565 B1
(45) Date of Patent: Jul. 1, 2003

(54) SYSTEM FOR IMPROVING A SPATIAL EFFECT OF STEREO SOUND OR ENCODED SOUND

(75) Inventor: Pyung Choi, Taegu (KR)

(73) Assignee: 3S-Tech Co., Ltd. (KR)

(*) Notice: Subject to any disclaimer, the term of this patent is extended or adjusted under 35 U.S.C. 154(b) by 0 days.

(21) Appl. No.: 08/944,211

(22) Filed: Oct. 6, 1997

(30) Foreign Application Priority Data

Mar. 13, 1997 (KR) ............ 97-8472
Mar. 28, 1997 (KR) ............ 97-12151
Mar. 28, 1997 (KR) ............ 97-12152
Apr. 17, 1997 (KR) ............ 97-15151

(51) Int. Cl.[7] ............ H04R 5/00; H03G 5/00
(52) U.S. Cl. ............ 381/98; 381/1
(58) Field of Search ............ 381/18, 19, 20, 381/98, 1

(56) References Cited

U.S. PATENT DOCUMENTS 4,121,059 A 10/1978 Nakabayashi
4,748,669 A 5/1988 Klayman
4,841,572 A 6/1989 Klayman
4,866,774 A 9/1989 Klayman
5,222,059 A * 6/1993 Holman ............ 369/89
5,251,260 A 10/1993 Gates
5,263,087 A 11/1993 Fosgate
5,579,396 A 11/1996 Iida et al.
5,850,453 A * 12/1998 Klayman et al. ............ 381/1
5,872,851 A * 2/1999 Petroff ............ 381/18
5,930,733 A * 7/1999 Park ............ 702/76

* cited by examiner

*Primary Examiner*—Forester W. Isen
*Assistant Examiner*—Brian T. Pendleton
(74) *Attorney, Agent, or Firm*—Norris, McLaughlin & Marcus P.A.

(57) ABSTRACT

A system for improving a spatial effect of stereo sound or encoded sound when producing three dimensional image sound signals from signals of stereo channel includes a spatial effect enhancing portion where a signal for enhancing spatial effect and directivity of sound is produced, a band enhancing portion where a signal for enhancing a signal component of the stereo channel signal in a low frequency range and for maintaining the signal component in a middle frequency range is generated, and a matrix portion where the output signal of the spatial effect enhancing portion, the output signal of the band enhancing portion and the stereo channel signal are calculated in a matrix manner, so that the spatial effect of sound is improved using a differential component between left and right side channel signals. According to the invention, the spatial effect of sound can be improved without using a complicated circuit construction, the deterioration of S/N ratio is prevented, and the cost performance for realizing a spatial effect of sound is remarkably improved.

10 Claims, 6 Drawing Sheets

SYSTEM FOR IMPROVING A SPATIAL EFFECT OF STEREO SOUND OR ENCODED SOUND

BACKGROUND OF THE INVENTION

1) Field of the Invention

The present invention relates to a system for improving a spatial effect of stereo sound or encoded sound, and particularly relates to a system for improving a spatial effect of stereo sound or encoded sound, e.g. sound processed by Dolby Prologic, AC3, THX or Digital Surround, which is suitably applied to a three dimensional stereo sound image processing technique. According to the invention, a spatial effect in stereo sound or encoded sound and background sound of music are emphasized when a three dimensional image sound is reproduced from a stereo signal using only two speakers; getting a "live" sound effect.

2) Related Art

As related arts for improving the spatial effect of stereo sound, there have been suggested in U.S. Pat. No. 4,748,669 "Stereo Enhancement System" or in U.S. Pat. No. 4,866,774 "Stereo Enhancement and Directivity". In these U.S. patents, a technique to improve the directivity and spatial effect of stereo sound is disclosed. According to the technique, stereo signals are processed in such a manner to improve the directivity and spatial effect of sound that a left side channel signal (L) and a right side channel signal (R) are added together or subtracted from each other to obtain L+R and L−R signals, the frequencies, phases and gains of these L+R and L−R signals are suitably varied; then these signals are calculated at left and right side matrix steps.

In these prior arts, it is essentially required to have a signal processing means for processing the L+R and the L−R signals; the L−R signal for forming a stereo sound image should be subjected to filters, gain controlling circuits and other calculating circuits in order to obtain a sound which has a three dimensional effect. However, according to the prior arts, the amount of the differential component of the left and right channel signals becomes extremely small in an output signal because the system is constructed such that the frequency of the L−R signal is processed and then the thus processed signal is calculated in the left and right channels, respectively. Further, there is a problem that the signal component is lacking in the middle frequency range, i.e. in a voice frequency range, and in the low frequency range, since most of the component of such processed signal are distributed in the high frequency range.

While, by adding the L+R signal to the final matrix step via a different signal lines, the sound is controlled so as to be reproduced at a central position of the left and right speakers; then a well balanced sound can be obtained. However, in such a signal processing system, since the original stereo signal is processed in various manners to obtain L+R and L−R signals and these signals are reconstructed at the matrix steps after getting the frequency compensation, a large amount of the original sound signal is lost while the three dimensional sense of sound may be obtained. Particularly, there is not left a stereo effect any more because the stereo signals could not be separated from each other well by adding the L+R signal (monophonic signal), so that the separation degree of the sound coming from the left and right speakers and the articulation of sound deteriorate in comparison to the stereo effect which is obtained using generic stereo type audio equipment.

According to the general characteristic of a circuit to reproduce a three dimensional image sound, when sound signals are subjected to a stereo processing circuit, the signal deteriorates in the voice frequency range. In addition to this, when the original stereo signals are reconstructed, some of the original sound is lost. Therefore, if a consumer hears such a sound for a long time, he or she may often feel uncomfortable. Furthermore, when the original sound is processed in filters or phase shifters, mutual interference or distortions are generated among the signals. The loss of a remarkable amount of original sound, which causes inconvenience or discomfort to listeners of music, particularly classical music, cannot be prevented by the conventional technique.

SUMMARY OF THE INVENTION

The present invention has for its purpose to provide a system for improving a spatial effect of stereo sound or encoded sound, by which the loss of the original sound can be restricted to a minimum and the sense of three dimensional sound image in the reproduced sound may be improved. According to the present invention, the background sound, which is inevitably decreased during the first signal mixing step of a sound recording process, is enhanced when the sound is reproduced, so that a "live" sense of sound can be obtained. According to the invention, the circuitry consists such that neither the L+R signals nor the L−R signals are processed in various circuits as is done in the above-mentioned prior arts; the channel signals are processed, but importance is given to each channel signal independently. Therefore, the unbalance of an acoustic field can be restricted to a minimum and the ratio between signal and noise and the total harmonic distortion can be decreased, so that the loss of the original sound signal becomes smaller and the directivity and spatial effect of sound can be improved and the "live" sense of sound is increased.

It is almost impossible to reproduce a beautiful sound extending over the whole frequency range, i.e. covering a low frequency range, a medium frequency range and a high frequency range, by using cheap or medium priced audio equipment, because the quality or performance of the amplifiers or speakers cannot help but be limited in such equipment. However, if the system according to the present invention is applied, it is possible to eliminate such a problem caused by the limitation of the quality or the performance of the amplifier or speakers to some degree. According to the system of the present invention, the output signal has a construction such that a gain characteristic is increased in a low frequency range taking an original sound signal as a leading part, the original signal and a differential component between the left and right side channels signals exist with a ratio of fifty/fifty in the middle frequency range, and a gain characteristic is increased in the higher frequency range taking the differential signal component of the left and right channel signals as a leading part, so that a natural and real sound effect can be produced. It should also be noted that it is possible to improve the sound reproducing characteristic of the audio signal even if cheap or middle priced audio equipment is used.

In other words, the system according to the invention, which has a symmetrical circuit construction so as to suitably process stereo signals, has realized a new concept of a "surround" system where the spatial effect of sound is improved using a differential component between the left and right channel sound signals, while keeping the circuit construction simple so that it can be said that the ratio between signal and noise is not deteriorated.

As will be stated below in detail, the basic construction of the system according to the present invention is to comprise a spatial effect enhancing portion where a spatial image of sound is extracted in a frequency selective manner, a frequency band enhancing portion where the original sound is enhanced in low frequency range and in the middle frequency range, and a channel matrix portion for calculating signals in a matrix manner.

BRIEF DESCRIPTION OF DRAWINGS

FIG. 2(*b*) is a graph illustrating a frequency characteristic of the output signal of the spatial effect enhancing portion depicted in FIG. 2(*a*);

FIG. 3(*b*) is a graph showing a frequency characteristic of the output signal of the band enhancing portion depicted in FIG. 3(*a*);

FIG. 9(*b*) is a graph representing a frequency characteristic of the output signal of the system shown in FIG. 9(*a*)

DETAILED EXPLANATION OF PREFERRED EMBODIMENTS

Figure 1:
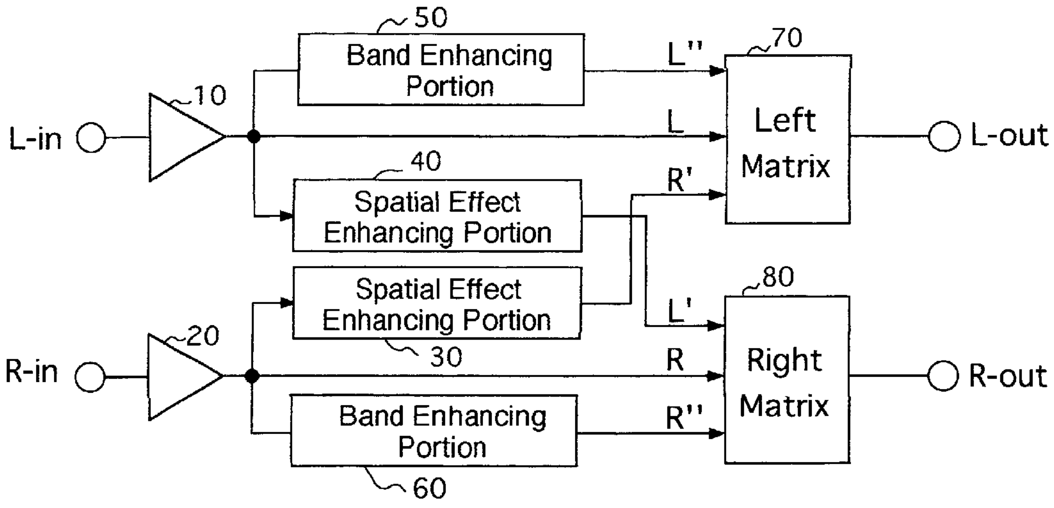
FIG. 1 is a block diagram showing a construction of the system according to the first embodiment of the present invention.

FIG. 1 is a block diagram showing a basic construction of a first embodiment of the system for improving a spatial effect of stereo sound or encoded sound according to the invention. The system is applied to audio equipment as a signal processor where a three dimensional stereo sound image signal is produced from stereo signals.

As shown in FIG. 1, the system of the first embodiment comprises a spatial effect enhancing portion (30) (40), a band enhancing portion (50) (60) and a channel matrix portion (70) (80) in each of left and right signal lines. In the spatial effect enhancing portion (30) (40), the left and right input signals (L-in) (R-in) are inputted, respectively, to produce a signal for enhancing a spatial effect and a directivity of sound in a reproduced sound; in the band enhancing portions (50) (60), the left and right input signals (L-in) (R-in) are inputted, respectively, to generate a signal for enhancing the signal components of the middle and low frequency ranges of an original sound; and in the channel matrix portions (70) (80), an output signal of said spatial effect improving portion, an output signal of said band enhancing portion, and the left and right channel signals are calculated in a matrix manner.

The system according to the present invention is constructed such that the left and right input signals (L-in) (R-in) are supplied to the portions via buffer amplifiers (10) (20), respectively. The reason why the buffer amplifiers are provided is to make a high signal input impedance. By the high signal input impedance, the attenuation and deterioration of signals, caused when the signals are transmitted through the circuits, is reduced in the view of frequencies.

As illustrated in FIG. 1, the input signals (L-in) (R-in) are inputted into the left and right side spatial effect enhancing portions (30) (40) and into the left and right side band enhancing portions (50) (60) via the buffer amplifiers (10) (20), respectively. Output signals from the spatial effect enhancing portions (30) (40) and the band enhancing portions (50) (60) are further supplied into the left and right side channel matrix portions (70) (80), respectively. In addition to this, each input signal (L-in) (R-in) is supplied into the channel matrix portion (70) (80), directly.

In the spatial effect enhancing portions (30) (40), signals L' and R' are produced which are used for generating directivity and spatial effect in a reproduced sound. As depicted in FIG. 1, the output signal L' of the left side spatial effect enhancing portion (40) is supplied to the right side matrix portion (80) and the output signal R' of the right side spatial effect enhancing portion (30) is supplied to the left matrix portion (70); calculations of L−R' and R-L' are conducted in the matrix portions (70) and (80), respectively.

The band enhancing portions (50) (60), which are provided for enhancing the original channel signals in the middle frequency range and the low frequency range, produce signal L" and R", respectively. The signals L" and R" are inputted into the left and right side matrix portions (70) (80) and are added to the results of said calculation of L−R" and R−L". That is to say, in the left and right side matrix portions (70) (80), the output signals L' and R' of the spatial effect enhancing portions (30) (40) and the output signals L" and R" of the band enhancing portions (50) (60) are calculated together in a matrix manner, so that the calculation of L−R'+L" is conducted in the left side channel to generate an output signal of (L-OUT) and the calculation of R−L'+R" is conducted in the right side channel to output an output signal of (R-OUT).

The spatial effect enhancing portions (30) (40) have a characteristic as a high pass filter, while the band enhancing portions (50) (60) have a characteristic as a low pass filter. By such an arrangement that these filters have a gain of about 1 in the middle frequency range, if the left and right channel signals have almost the same component in their middle frequency range, all of the signals L, L', L", R, R' and R" become equal, i.e. L=L'=L"=R=R'=R". Therefore, in this case, when the calculations of L−R'+L" and R−L'+R" are conducted in the matrix portions (70) and (80), the output signal of the left side channel (L-OUT) becomes L=R=1, and the output signal of the right side channel (R-OUT) becomes R=L=1. While, if there is some difference between the left and right channel signals in the middle frequency range, the output signal of the left side channel (L-OUT) becomes L+(L"−R'), and the output signal of the right side channel (R-OUT) becomes R+(R"−L'). According to such an arrangement, the original signal can be kept as it is in the middle frequency range without respect to the fact that the signal components of the left and right side original signals are the same or not in the middle frequency range.

In the lower frequency range of the output signal of the spatial effect enhancing portion, the signal components R' and L' only have a small gain. Therefore, when the calculations of L–R'+L" and R–L'+R" are done in the matrix portions, the amount of signal components of L+L" and R+R" become relatively great. As a result, the signal component of the original signal in the lower frequency range is enhanced when signals are outputted from the matrix portions.

On the other hand, in the higher frequency range where the directivity and the spatial effect of sound is determined, the gain of the output signals L" and R" of the band enhancing portions (50) (60) is small, but the gain of the output signals R' and L' of the spatial effect enhancing portions (30) (40) is almost one (1). Therefore, when the calculations of L–R'+L" and R–L'+R" are done in the matrix portions, the leading part of the calculation becomes L–R' and R–L', so that the spatial effect and the directivity of the reproduced sound is increased.

Namely, according to the present invention, the frequency range of the original sound signal is roughly divided into three ranges, i.e. a low frequency range, a middle frequency range and a high frequency range; the original channel signals are enhanced in the lower frequency range; the original channel signals are kept as they are in the middle frequency range; and the mutually subtracted signal component of the original left and right channel signals are enhanced in the higher frequency range. As a result, the spatial effect and the directivity of sound of the reproduced sound is improved, while keeping the balance of sound well extending all over the frequency ranges.

Figure 2A:
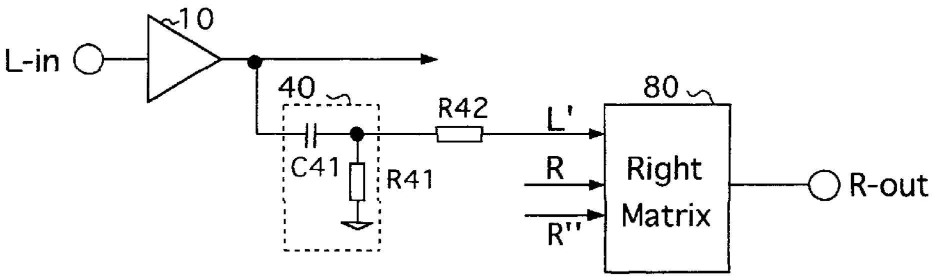
FIG. 2(*a*) is a circuit diagram depicting a construction of the spatial effect enhancing portion of the system according to the present invention.
Figure 2B:
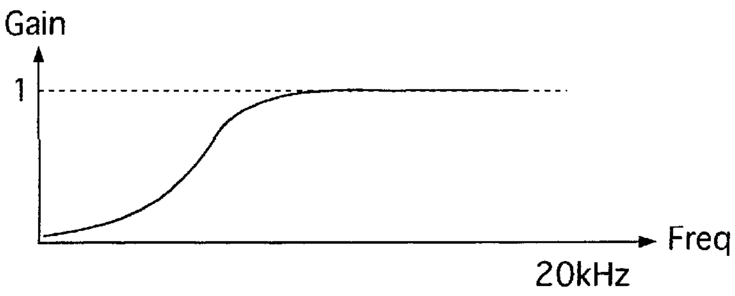

FIG. 2 is a block diagram depicting a detail construction of the system for improving a spatial effect of stereo sound or encoded sound according to the present invention: FIG. 2(*a*) is a circuit diagram of the spatial effect enhancing portion and FIG. 2(*b*) is a graph showing the frequency-gain characteristic of an output of the spatial effect enhancing portion. As stated above, the spatial effect enhancing portion is provided in each channel and has a circuit construction to produce the signal R' or L' which is used for enhancing the spatial effect, the directivity and the background of the reproduced sound.

The basic concept of the spatial effect enhancing portion is to pass the signal components existing in a higher frequency range, which is determined by taking the voice frequency range as a center part, to produce the signals R' and L'; the signals R' or L' are subtracted from the relevant channel signal in the matrix portions, respectively, in order to derive signal components for realizing the three dimensional sound image. General stereo signals have a great amount of signal component which are common to the left and right side channel signals in the middle and lower frequency ranges; while, a stereo sound signal component, by which the reproduced sound is actually separated into left and right sides, and a three dimensional signal component exist in the higher frequency range. Therefore, by frequency-selectively passing the signal component existing in the higher frequency range, which is determined by taking the voice frequency range as a center part, and subtracting the thus filtered signal from the relevant channel signal, the signal component representing the three dimensional sound image can be derived from the original sound signal.

As illustrated in FIG. 2(*a*), the spatial effect enhancing portion (40) has a circuit construction constitutive of a capacitor (C41) and a register (R41) so as to work as a high pass filter. The gain characteristic to determine the signal passing frequency range and the signal interrupting frequency range thereof is controlled by the time constants of the capacitor (C41) and the register (R41). Further, the middle frequency range of sound is controlled by adjusting the time constants of the capacitor and register to obtain a sense of "attendance" sound. The spatial effect enhancing portion (40) (50) produces the signal components R' and L' which are subtracted from the relevant channel signal in the matrix portions; the circuit works as a high pass filter arranged such that the gain is almost one (1) in the middle and higher frequency range and an interrupting frequency is in a lower frequency range. An example of the frequency characteristic of an output signal of the spatial effect enhancing portion 40 is shown in FIG. 2(*b*).

As stated above, the amount of the three dimensional stereo image signal can be freely controlled by adjusting the time constants of the register (R41) and the capacitor (C41) which constitute of the spatial effect enhancing portion (40). Further, various types of three dimensional stereo sound image can be obtained from the spatial effect of sound by adjusting the time constants of these elements.

In the down stream side of the spatial effect enhancing portion (40), a register (R42) is provided to determine a calculating factor of the matrix calculating circuit of the right side channel matrix portion (80), which works to carry out the subtraction of the signal L' when the calculation of R–L'+R" is conducted in the matrix portion (80).

Figure 3A:
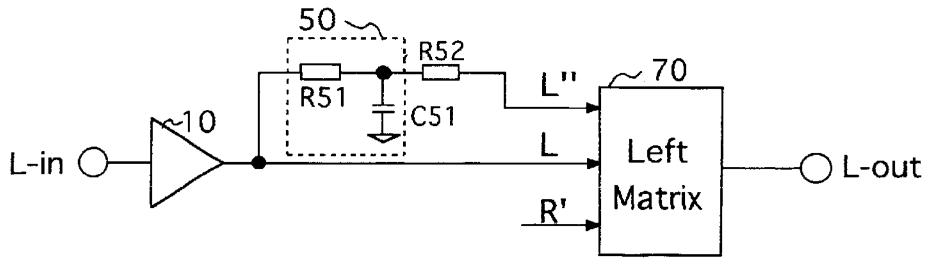
FIG. 3(*a*) is a circuit diagram representing a construction of the band enhancing portion of the system according to the present invention.
Figure 3B:
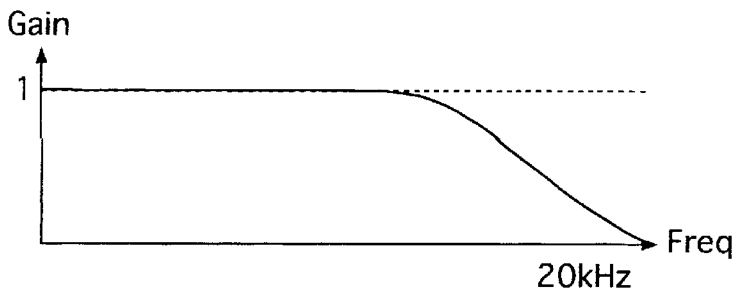

FIG. 3 is a block diagram showing a detail of the band enhancing portion (50) of the system according to the present invention; FIG. 3(*a*) is a circuit diagram for the constitution of the band enhancing portion; and FIG. 3(*b*) is a graph representing a frequency-gain characteristic of an output signal of the band enhancing portion. The band enhancing portion has a function to enhance the middle and lower frequency components of the channel signal, which is attenuated when the subtraction (L–R') is carried out in the matrix portion. The band enhancing portion has a characteristic as a low pass filter. Since said signal component of R', which is corresponding to the output signal of the spatial effect enhancing portion, has a gain of almost one (1) in the middle and higher frequency ranges, when the calculation of (L–R') is conducted in the matrix portion, the sound is relatively attenuated in the middle frequency range. According to the invention, the signals attenuated in the middle frequency range are enhanced in the band enhancing portion in order to prevent that the central part of sound is lost.

As shown in FIG. 3(*a*), the band enhancing portion (50) is constituted of a register (R51) and a capacitor (C51); the interrupting frequency of the lower pass filter is determined by the time constants of the register (R51) and the capacitor (C51). According to the invention, the band enhancing portion (50) works as a low pass filter having an interrupting frequency in a higher frequency range. Since the voice frequency range is around 1 kHz, the filter has a gain of almost one (1) in the middle frequency range, i.e. the voice frequency range, and also has a gain of almost one in the lower frequency range so as to enhance not only the voice frequency range but the lower frequency range of the channels signals.

The register (R51) and the capacitor (C51) work as a low pass filter for enhancing the middle and lower frequency ranges of the channel signal. A register (R52) is further provided in the lower stream side of the band enhancing portion (50) being connected to the left side channel matrix portion (70). This register (R52) is provided to determine a calculating factor of the signal component L" when the calculation of L−R'+L" is conducted in the left channel matrix portion (70). An example of the output signal of the ban enhancing portion 50 is shown in FIG. 3(*b*).

Figure 4:
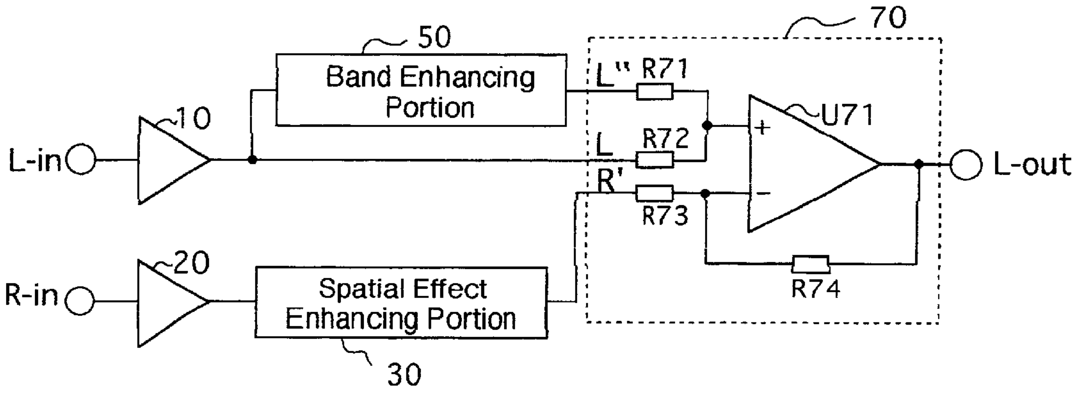
FIG. 4 is a circuit diagram depicting a construction of the matrix portion of the system according to the present invention.

FIG. 4 is a circuit diagram depicting a detailed construction of the matrix portion of the system according to the invention. In this matrix portion (70), the channel signal, the output signal of the band enhancing portion (50) and the output signal of the spatial effect enhancing portion (30) are added and subtracted together using the adding and subtracting functions of an operational amplifier (U71). That is to say, the left side channel signal L and the output signal L" of the band enhancing portion (50) are inputted into a non-inverting input terminal (+), and the output signal R' of the spatial effect enhancing portion (30) is inputted into an inverting input terminal (−), respectively.

The calculating factors of the left side channel matrix portion (70) are determined by the values of registers (R71) (R72) (R73) and (R74). If arranging all of the resistance values of these registers the same, the output of the channel matrix portion (70) becomes L+L"−R' in accordance with the adding and subtracting structure of the operational amplifier (U71); the output of the right side channel matrix portion (80) which has the same construction as that of the matrix portion (70) becomes R+R"−L'. That means all of the factors for adding and subtracting the signals are set forth to one (1). While, if the resistance values of the registers (R71) (R72) (R73) and (R74) are changed, it would be possible to obtain suitable factors as occasion demands.

The best mode of the calculating factors in the matrix portion should be determined depending on a listening condition or a listening characteristic of users when actually functioning audio equipment to play music. The above-mentioned left side and right side outputs of L+L"−R' and R+R"−L' can be considered as one of examples. That is to say, various arrangements of the calculating factors of the matrix portion can be considered in accordance with an environmental condition of the audio equipment, such as a power supply, or the other applied conditions, so that any type of arrangement of the calculating factors can be applied on the matrixes as occasional demands. Furthermore, by adding or removing a register(s) to the matrix circuit (70) and (80), the gain factors can also be adjusted.

Figure 5:
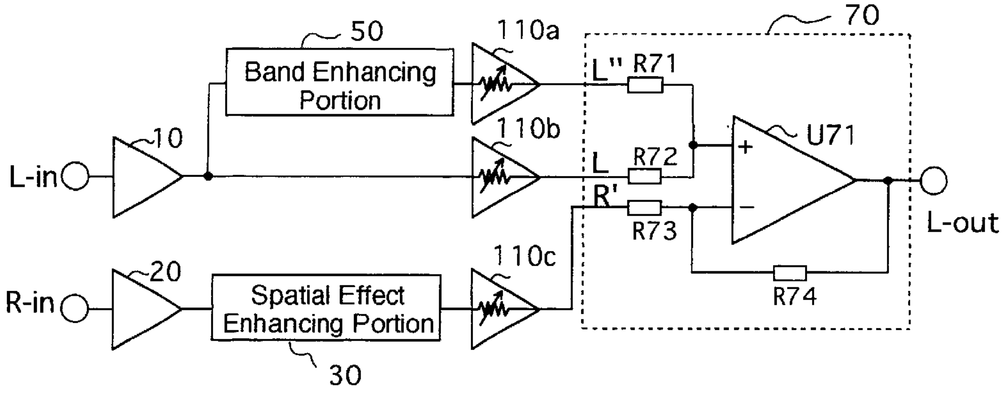
FIG. 5 is a circuit diagram illustrating a modified construction of the matrix portion of the system according to the present invention.
Figure 6:
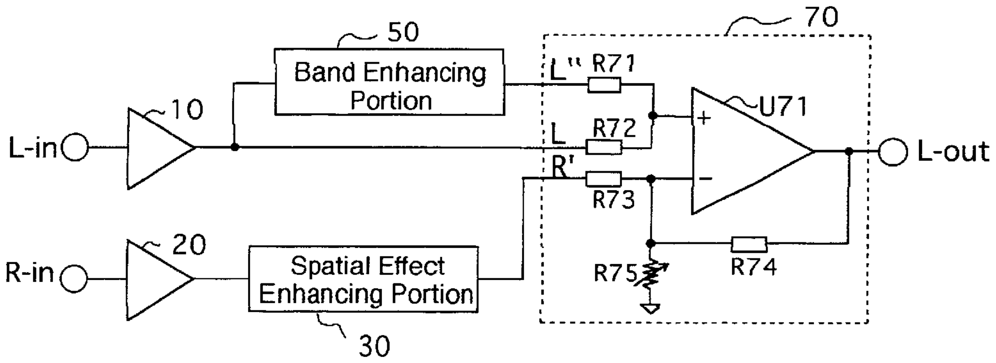
FIG. 6 is a circuit diagram representing another modified construction of the matrix portion of the system according to the present invention.
Figure 7A:
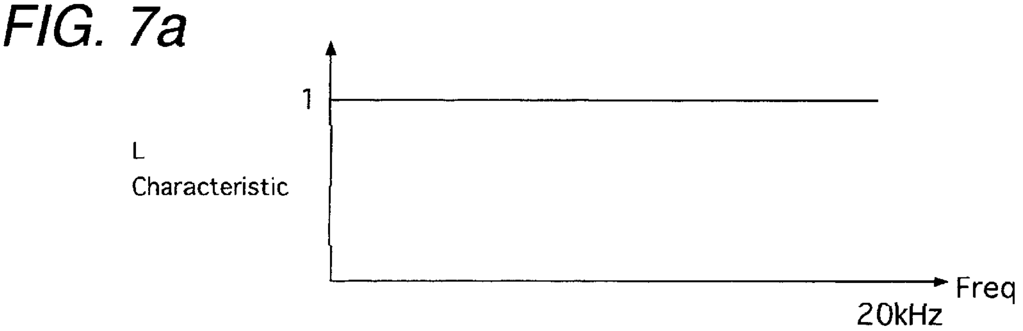
FIGS. 7(*a*) to (*e*) are graphs showing frequency-gain characteristics of the system according to the present invention.
Figure 7B:
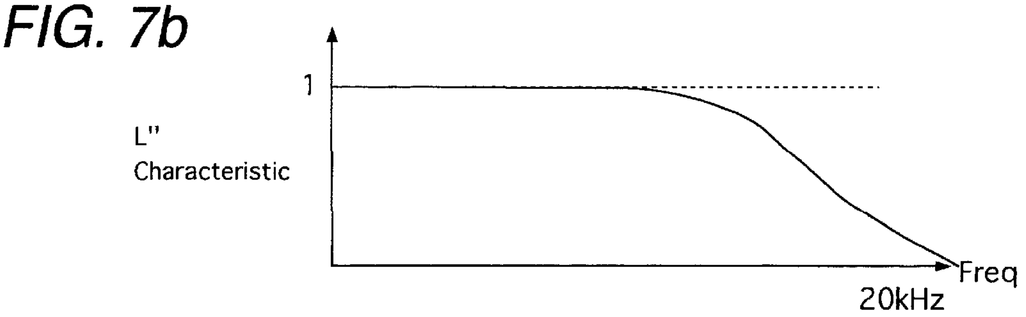
Figure 7C:
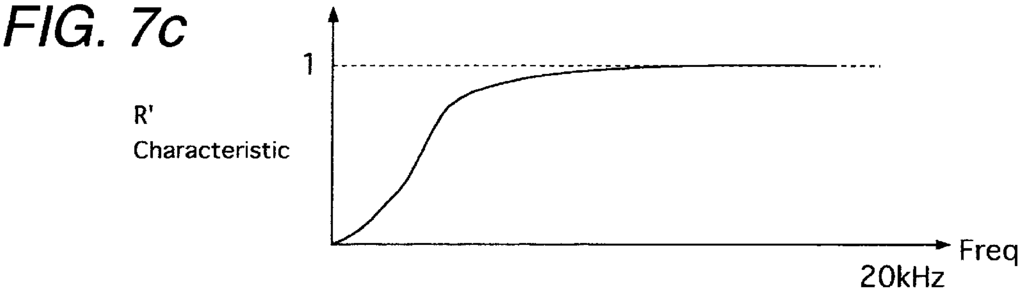
Figure 7D:
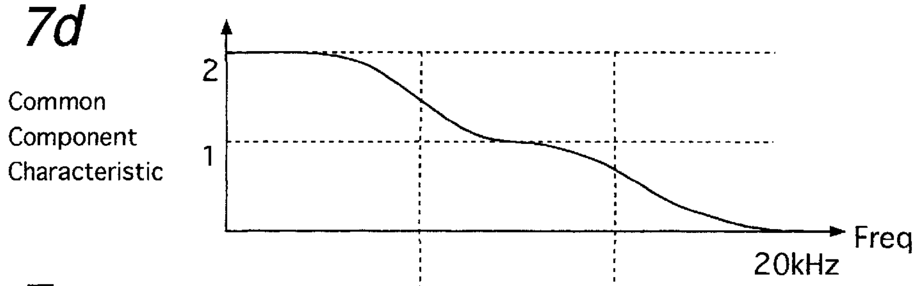
Figure 7E:
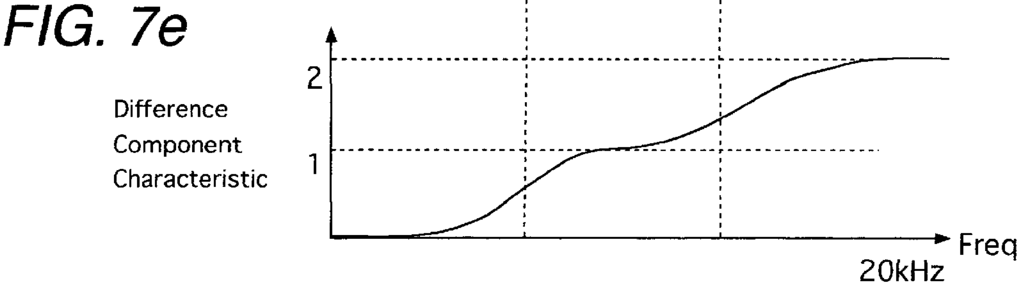

In order to obtain an effect to enhance the spatial effect of sound more, it may be possible to provide another circuits (110*a,* 110*b,* 110*c*) for the purpose of gain controlling in the down stream side of the spatial effect enhancing portion (40) and the band enhancing portion (50) and on the channel signal line, respectively, as shown in FIG. 5 so that the mutual gain of these circuits can be controlled from outside. It also may be possible to provide a variable register (R75) in the matrix circuits (70) and (80) as shown in FIG. 6, so as to make possible to change the mutual gain form outside. According to such an arrangement that the mutual gain of the output signal of the spatial effect enhancing portion, the output signal of the band enhancing portion and the channels signal can be controlled from outside by providing elements for adjusting the mutual gain before the matrix circuits (70) and (80) or the variable registers in the matrix circuit in such a manner, it would be possible to control the gain in each frequency range in accordance with the listening condition of the user or the condition of the external equipment, such as a power supply, so that a much more highly qualified sound can be obtained.

FIGS. 7(*a*) to (*e*) are graphs illustrating the frequency-gain characteristics of each signals of the system according to the invention as a whole. It should be noted only the calculation conducted in the left side matrix circuit (70) is shown, but the same calculation is conducted in the right side matrix circuit (80) whose explanation is omitted here.

FIG. 7(*a*) is a graph showing a frequency characteristic of the left side channel signal (L). The signal L is supplied into the band enhancing portion (50) and the left side matrix portion (70) via the buffer amplifier (10). As shown in this graph, the signal L has a gain of one (1) extending all over the audible frequency range.

FIG. 7(*b*) is a graph depicting a frequency characteristic of the output signal L" of the band enhancing portion, i.e. a low pass filter. As clear from this graph, the output signal L" has a characteristic such that the gain is almost one (1) in the middle and lower frequency ranges, but the gain gradually decreases as the frequency range becomes higher than 10 kHz.

FIG. 7(*c*) is a graph illustrating a frequency characteristic of the output signal R' of the spatial effect enhancing portion (30), i.e. a high pass filter. The signal R', which has a large amount of signal component in the middle and higher frequency ranges, is derived from the right side channel signal; the signal R' is supplied to the left side matrix portion (70) to be subtracted from the left side channel signal L. The spatial effect enhancing portion (30) has a high pass filter characteristic to pass signals having a frequency of about 100 Hz or more; thus the signal R' has a frequency characteristic such that the gain is almost one (1) in the frequency range of 100 Hz or more.

It should be noted that the spatial effect enhancing portion (30) and the band enhancing portion (50) may be possible to be arranged that the resistance values of the registers (R31) and (R41) are variable. According to such an arrangement, the time constants of the filters can be changed so that the interrupting frequencies of these portions can be arbitrarily adjusted. In the case of manufacturing a large amount of the system at once, it may be, of course, possible to make the time constants of the filters constant.

FIG. 7(*d*) is a graph representing a frequency characteristic of a common signal component of the left and right side channels signals L and R. As clear from FIG. 7(*d*), a large amount of signal component in the middle and lower frequency ranges is contained in the signal component common to the left and right side channel signals. That is to say, since the signal component common to the left and right side channel signals is distributed in the voice frequency range and the lower frequency range due to the characteristic of general stereo sound, the sound usually has a characteristic that the left side channel signal and the right side channel signal are almost equal to other (L=R) in these ranges. According to the invention, the calculating formula in the left side channel matrix portion (70) is L+L"−R'; when substituting the value of L=R=1 into the formula, the calculated result becomes L=L"=1 in the lower frequency range, so that the signal distribution of R' becomes small. As a result, the gain becomes almost two (2) in the lower frequency range, and then gradually becomes smaller as the frequency higher. Further, in the middle frequency range, the calculated result becomes L=L"=R'=1, so that the gain of about one (1) can be maintained in this range.

According to the above explained construction, it is possible to obtain an output signal where the sound is enhanced in the lower frequency range; the signal component in the voice frequency range, i.e. the middle frequency range, can be maintained in spite of that there is a small difference of gain depending on the similarity of the left and right side channel signals. In other words, the lower frequency component of the original channel signal is reproduced in an enhanced manner and the middle frequency component thereof is kept as it is.

FIG. 7(*e*) is a graph showing a frequency of the output signal of the system characteristic in the higher frequency range, i.e. a difference component of the left and right side channel signals, by which the spatial effect of the reproduced sound is determined. Generally speaking, according to the characteristics of the stereo sound source, or the hearing characteristic of human being, the spatial effect or the directivity of sound is recognized by the signal components existing in the middle and higher frequency ranges. According to the invention, since the calculating formula of the matrix portion is L+L"−R' and a great amount of the signal component common to the left and right channel signals is contained in the middle frequency range, it can be assumed to have L=L"=R'=1 in the middle frequency range. Therefore, the calculated result in the matrix portion becomes almost one (1), so the signal component in the middle frequency range, i.e. voice frequency range, can be kept as it was. On the other hand, in the higher frequency range, the amount of the signal component L" outputted from the band enhancing portion is relatively small. Therefore, in the higher frequency range the output signal of the matrix portion is mainly constituted of the difference component (L−R') of the output signal R' of the spatial enhancing portion and the left side channel signal L. It means, while maintaining the center part of the reproduced sound as it is, the spatial effect or the background sound can be enhanced in the reproduced sound, because the difference component of the signals largely occupies in the higher frequency range where the spatial effect or the directivity of sound is determined.

As explained above, according to the invention, the original sound (sound in the voice frequency range) is maintained or enhanced in the middle and lower frequency ranges and the original sound is kept as it was and the spatial effect of sound is enhanced in the middle and higher frequency ranges; thus such an ideal sound can be obtained that an attendance since of sound is improved while reproducing a well balanced sound extending all over the frequency range.

Figure 8:
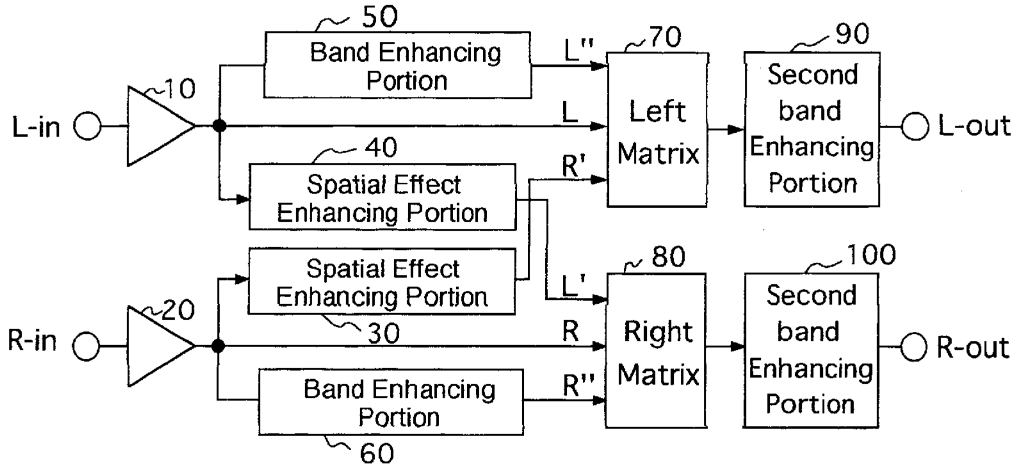
FIG. 8 is a block diagram depicting a construction of the system according to the second embodiment of the present invention.

FIG. 8 is a block diagram illustrating a whole construction of the system according to the second embodiment of the present invention. As shown in FIG. 8, in the second embodiment, second band enhancing portions (90) and (100) are provided after the matrix portions (70) and (80), respectively, so that the output signal of the system can be enhanced in the spatial frequency range after the gain of the system as a whole is increased in the matrix portions.

Figure 9A:
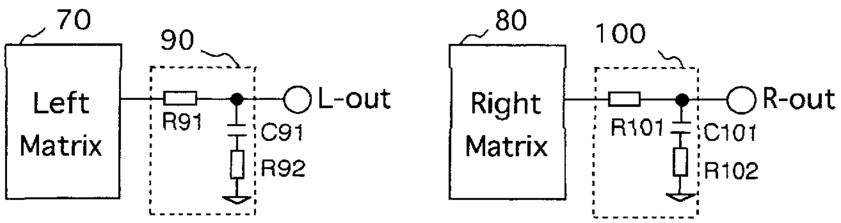
FIG. 9(*a*) is a circuit diagram illustrating a detail construction of the system according to the second embodiment.
Figure 9B:
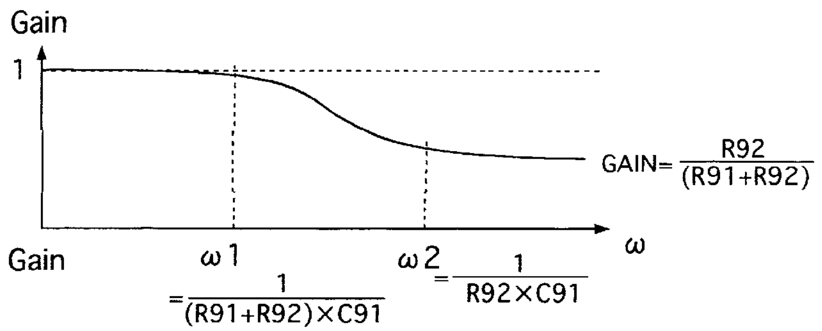

FIG. 9 is a block diagram depicting the construction of the circuits provided after the matrix portion in the second embodiment; FIG. 9(*a*) is a block diagram representing the circuit structure of the second band enhancing portions in detail; FIG. 9(*b*) is a graph showing the characteristic of the output signal of the second band enhancing portion.

As explained above, according to the invention, a sound which is well balanced sense in the lower, middle and higher frequency ranges and has a good attendance can be reproduced by the matrix calculations conducted in the matrix portions (70) and (80). However, according to the second embodiment, it is constituted such that the outputs of the matrix portions are filtered again by the second band enhancing portions (90) (100), which are provided in the downstream side of the matrix portions, so that the particular frequency range can be further enhanced. According to the second embodiment, the system can be suitably applied to special kind of soft ware, such as a movie soft ware, where, for instance, signals in the lower frequency range should be enhanced more. The circuit construction for the second band enhancing portions (90) and (100) can be modified in several manners. It may be possible to use a passive circuit constituted of a register and a capacitor as shown in FIG. 9(*a*) or an active circuit constituted of an operational amplifier and other passive elements for the second band enhancing portion.

In the second embodiments of the present invention, the second band enhancing portion (90) is constituted of a passive filter, i.e. a register (R91), (R92) and a capacitor (C91) as well as the second band enhancing portion (100) on the right side channel. As apparent from the graph in FIG. 9(*b*), the filter has a characteristic that the gain of the signal passing range is almost one (1) and the gain of the signal interrupting range is R92/(R91+R92). Therefore, it is possible to enhance the output signal in the lower frequency range by passing the output signal of the matrix circuit through the filter. It is also possible to adjust the gain of the output signal of the matrix circuit in the middle and higher frequency ranges. Furthermore, it is possible to adjust the gain of the output signal in a particular frequency range independently as occasional demand by using an active circuit.

Figure 10:
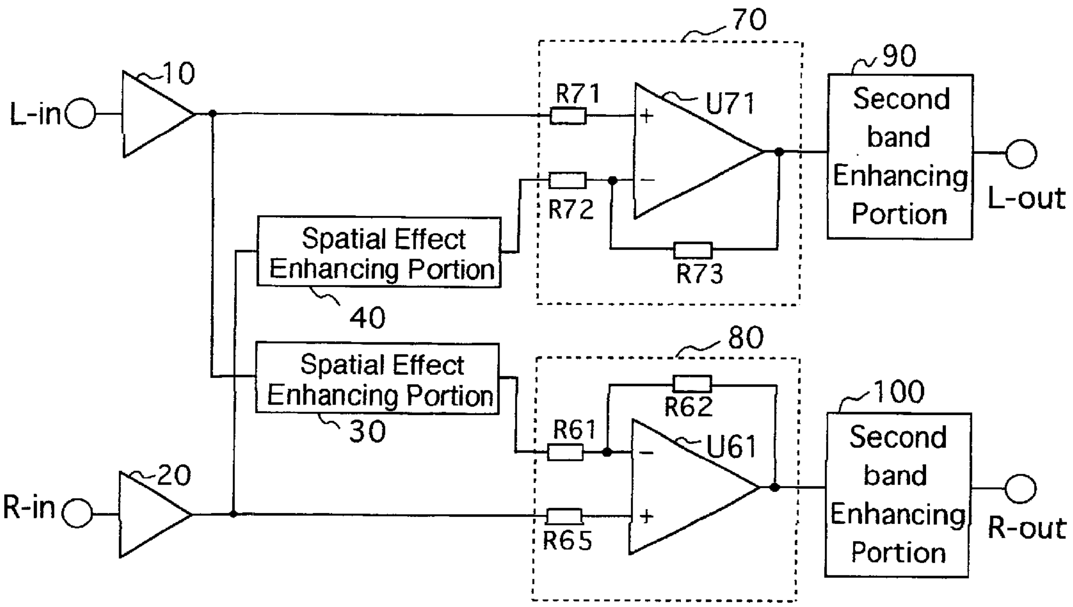
FIG. 10 is a block diagram showing a construction of the system according to the third embodiment of the present invention.

FIG. 10 is a block diagram showing a third embodiment of the system according to the invention. In the third embodiment, no band enhancing portion (50) (60) is provided in order to make the circuit construction simpler, but the system is constituted such that the channel matrix portions (70) (80), to which the channel signals are inputted, respectively, also work as the band enhancing portion. It should be noted that the spatial effect enhancing circuits (30) (40) are provided as well as the other embodiments.

The system according to the present invention has a function that the original sound signal is enhanced in the lower frequency range, the original sound signal is maintained as it was in the middle frequency range, and the attendance sense and the directivity of sound is improved in the higher frequency range. It is also possible to arrange the system to enhance a particular frequency range in accordance with the sort of the original sound.

The present invention can be applied to every kind of equipment where the three dimensional image sound is reproduced from stereo signals or encoded signals. Moreover, the present invention can be applied not only to reproduce audio signals but also to record audio signals.

According to the present invention, an excellent three dimensional acoustic sound can be obtained by applying the above explained circuits on the audio stereo signal lines. A remarkable effect to reproduce the suitable background sound, which has not been realized according to the prior surround technique, can be obtained and the dynamic range of the reproducing sound signal can be enhanced in accordance with the filter curve characteristic of the system. If the time constant of each element provided in each circuit is adjusted so as to make it suitable for the condition to which the system is applied, an excellent attendance sense of sound and an effective enhancement of the background sound can be obtained.

What is claimed is:

1. A system for improving a spatial effect of stereo sound or encoded sound when producing three dimensional image sound signals from a left stereo channel signal and a right stereo channel signal, comprising for each of sad left and right stereo channel signals: a spatial effect enhancing means for producing a signal for enhancing a spatial effect and a directivity of sound; a band enhancing means for generating a signal for enhancing a signal component in a first predetermined frequency range of said stereo channel signal and maintaining a signal component in a second predetermined frequency range of said stereo channel signal; and a matrix means for calculating an output signal of said spatial effect enhancing means, an output signal of said band enhancing means and said stereo channel signal in a matrix manner;

wherein said spatial effect enhancing means has a characteristic as a high pass filter having an interrupting frequency in a lower frequency range so that a spatial effect and a directivity of sound of a reproduced sound, which is determined by a signal component in a high frequency range, is improved and a signal component of an output signal of said system is kept as that of an original sound signal in a middle frequency range, when said band enhancing means has a characteristic as a low pass filter having an interrupting frequency in a higher frequency range so that a signal component of output signal of said system is enhanced in a lower frequency range and a signal component of an output signal of said system is kept as that of an original sound signal in a middle frequency range wherein said matrix means has a characteristic in that an output signal of the matrix means provided in a left side stereo channel is αL+βL"−γR' and an output signal of said matrix means provided in a right side stereo channel is αR+βR"−γL', where the reference symbols α, β, and γ are factors for conducting said calculations in the matrix means, wherein output signals L" and R" have a characteristic in that a signal component in a low frequency range is passed through, signals L' and R' have a characteristic in that a signal component in a high frequency range is passed through, and said factors of α, β, and γ are able to be set in an arbitrary manner.

2. A system for improving a spatial effect of stereo sound or encoded sound according to claim 1, wherein said system further comprises a second band enhancing means for enhancing a particular frequency range of an output signal of said matrix means in each stereo signal line.

3. A system for improving a spatial effect of stereo sound or encoded sound according to claim 2 wherein a channel buffer means is provided before circuit elements for processing stereo signals to make a three dimensional sense on an output sound, in each signal line of said stereo channel.

4. A system for improving a spatial effect of stereo sound or encoded sound when producing three dimensional image sound signals from a left stereo channel signal and a right stereo channel signal, comprising for each of said left and right stereo channel signals: a spatial effect enhancing means for producing a signal for enhancing a spatial effect and a directivity of sound; a band enhancing means for generating a signal for enhancing a signal component in a first predetermined frequency range of said stereo channel signal and maintaining a signal component in a second predetermined frequency range of said stereo channel signal; and a matrix means for calculating an output signal of said spatial effect enhancing means, an output signal of said band enhancing means and said stereo channel signal in a matrix manner; and a gain control means for controlling mutual gain among an output signal of said spatial effect enhancing means, an output signal of said band enhancing means, and said stereo channel signal;

wherein said spatial effect enhancing means has a characteristic as a high pass filter having an interrupting frequency in a lower frequency range so that a spatial effect and a directivity of sound of a reproduced sound, which is determined by a signal component in a high frequency range, is improved and a signal component of an output signal of said system is kept as that of an original sound signal in a middle frequency range;

wherein said band enhancing means has a characteristic as a low pass filter having an interrupting frequency in a higher frequency range so that a signal component of output signal of said system is enhanced in a lower frequency range and a signal component of an output signal of said system is kept as that of an original sound signal in a middle frequency range; and wherein said matrix means has a characteristic in that an output signal of the matrix means provided in a left side stereo channel is a L+βL"−γR' and an output signal of said matrix means provided in a right side stereo channel is αR+βR"−γL', where the reference symbols α, β, and γ are factors for conducting in tat a signal component in a low frequency range is passed through said calculations in the matrix means; and wherein output signals L" and R" have a characteristic as a low pass filter, signals L' and R' have a characteristic in that a signal component in a high frequency range is passed through, and said factors of α, β, and γ are able to be set in an arbitrary manner.

5. A system for improving a spatial effect of stereo sound or encoded sound according to claim 4, wherein said system further comprises a second band enhancing means for enhancing an particular frequency range of an output signal of said matrix means in each stereo signal line.

6. A system for improving a spatial effect of stereo sound or encoded sound according to claim 3 wherein said mutual gain is controlled in such a manner that a gain for a common signal component of said stereo channel signals is great in a lower frequency range, but keeping an original signal as that of an original sound signal in a middle frequency range, and that a gain for a difference component of said stereo channel signals is great in a higher frequency range, but keeping an original signal as that of an original sound signal in a middle frequency range.

7. A system for improving a spatial effect of stereo sound or encoded sound according to claim 6 wherein a channel buffer means is provided before circuit elements for processing stereo signals to make a three dimensional sense on an output sound, in each signal line of said stereo channel.

8. A system for improving a spatial effect of stereo sound or encoded sound when recording a left stereo channel signal and a right stereo channel signal as three dimensional image sound signals comprising, for each of said left and right stereo channel signals, a spatial effect enhancing means for producing a signal for enhancing a spatial effect and a directivity of sound; a band enhancing means for generating a signal for enhancing a signal component in a first predetermined frequency range of said stereo channel signal and maintaining a signal component in a second predetermined frequency range of said stereo channel signal; and a matrix means for calculating an output signal of said spatial effect enhancing means, an output signal of said band enhancing means and said stereo channel signal in a matrix manner;

wherein said spatial effect enhancing means has a characteristic as a high pass filter having an interrupting frequency in a lower frequency range so that a spatial effect and a directivity of sound of a reproduced sound, which is determined by a signal component in a high frequency range, is improved and a signal component of an output signal of said system is kept as that of an original sound signal in a middle frequency range;

wherein said band enhancing means has a characteristic as a low pass filter having an interrupting frequency in a higher frequency range so that a signal component of output signal of said system is enhanced in a lower frequency range and a signal component of an output signal of said system is kept as that of an original sound signal in a middle frequency range; and wherein said matrix means has a characteristic in that an output signal of the matrix means provided in a left side stereo channel is $\alpha L+\beta L''-\gamma R'$ and an output signal of said matrix means provided in a right side stereo channel is $\alpha R+R''-\gamma L'$, where the reference symbols $\alpha$, $\beta$, and $\gamma$ are factors for conducting said calculations in the matrix means; and wherein output signals L" and R" have a characteristic in that a signal component in a low frequency range is passed through, signals L" and R" have a characteristic in that a signal component in a high frequency range is passed through, and said factors of $\alpha$, $\beta$, and $\gamma$ are able to be set in an arbitrary manner.

9. A system for improving a spatial effect of stereo sound or encoded sound according to claim 8 wherein said system further comprises a second band enhancing means for enhancing a particular frequency range of an output signal of said matrix means in each stereo signal line.

10. A system for improving a spatial effect of stereo sound or encoded sound according to claim 9 wherein a channel buffer means is provided before circuits elements for processing stereo signals to make a three dimensional sense on an output sound, in each signal line of said stereo channel.

* * * * *